United States Patent
Chuang

(10) Patent No.: US 9,954,520 B2
(45) Date of Patent: Apr. 24, 2018

(54) POWER ON RESET CIRCUIT APPLIED TO GATE DRIVER OF DISPLAY APPARATUS

(71) Applicant: Raydium Semiconductor Corporation, Hsinchu (TW)

(72) Inventor: Kai-Lan Chuang, Tainan (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 65 days.

(21) Appl. No.: 15/164,708

(22) Filed: May 25, 2016

(65) Prior Publication Data
US 2016/0359478 A1    Dec. 8, 2016

(30) Foreign Application Priority Data
Jun. 2, 2015  (TW) .............................. 104117813 A

(51) Int. Cl.
*H03K 17/22*    (2006.01)
*G09G 3/20*    (2006.01)

(52) U.S. Cl.
CPC ............. *H03K 17/223* (2013.01); *G09G 3/20* (2013.01); *G09G 2300/0426* (2013.01); *G09G 2310/0267* (2013.01); *G09G 2310/061* (2013.01)

(58) Field of Classification Search
CPC ..................................................... H03K 17/223
See application file for complete search history.

(56) References Cited

U.S. PATENT DOCUMENTS

| | | | | |
|---|---|---|---|---|
| 5,103,115 A | * | 4/1992 | Ueda .................... | H03K 17/223 327/143 |
| 6,329,852 B1 | * | 12/2001 | Seo ...................... | H03K 17/223 327/143 |
| 9,729,138 B1 | * | 8/2017 | Gonzales ............. | H03K 17/223 |

* cited by examiner

*Primary Examiner* — Hai L Nguyen

(57) ABSTRACT

A power on reset circuit applied to a gate driver of a display apparatus is disclosed. The power on reset circuit is coupled between an operating voltage and a ground terminal. The power on reset circuit includes an output terminal, a first transistor, a second transistor, a resistor, and a buffer circuit. The first transistor is coupled between the operating voltage and a first node. A gate of first transistor is coupled to the first node. The second transistor is coupled between the operating voltage and the first node. A gate of second transistor is coupled to the ground terminal. The resistor is coupled between the first node and ground terminal. The buffer circuit is coupled between the first node and output terminal and outputs a reset signal through the output terminal. A second threshold voltage of second transistor is larger than a first threshold voltage of first transistor.

9 Claims, 5 Drawing Sheets

US 9,954,520 B2

POWER ON RESET CIRCUIT APPLIED TO GATE DRIVER OF DISPLAY APPARATUS

BACKGROUND OF THE INVENTION

Field of the Invention

This invention relates to a gate driver of a display apparatus, especially to a power on reset circuit applied to the gate driver of the display apparatus.

Description of the Related Art

Please refer to FIG. 1. FIG. 1 illustrates a schematic diagram of a conventional power on reset circuit. As shown in FIG. 1, the power on reset circuit 1 is applied to the gate driver of the display apparatus; the power on reset circuit 1 is coupled between an operating voltage VDD and a ground terminal GND and the power on reset circuit 1 is used to output a reset signal RESET. Wherein, a P-type transistor MP1 is coupled between the operating voltage VDD and a node A and a gate electrode of the P-type transistor MP1 is coupled to the ground terminal GND; a plurality of N-type transistors MN1~MN4 are coupled in series between the node A and the ground terminal GND and gate electrodes of the plurality of N-type transistors MN1~MN4 are all coupled to the operating voltage VDD; a plurality of inverters INV1~INV4 are coupled in series between the node A and an output terminal OUT of the power on reset circuit 1; gate electrodes of the plurality of N-type transistors MN5~MN8 are coupled between the node A and the inverter INV1, between the inverters INV1 and INV2, between the inverters INV2 and INV3 and between the inverters INV3 and INV4 respectively; source electrodes and drain electrodes of the plurality of N-type transistors MN5~MN8 are all coupled to the ground terminal GND.

However, as shown in FIG. 2 and FIG. 3, when the power is turned off, if the operating voltage VDD is only decreased from 3.3 volts to 0.5 volts instead of being decreased to 0 volt, the reset signal RESET outputted by the power on reset circuit 1 may be decreased to 0 volt as shown in FIG. 2 or maintained at 0.5 volts as shown in FIG. 3. Once the reset signal RESET is maintained at 0.5 volts as shown in FIG. 3, when the power is turned on again, the operating voltage VDD will be increased from 0.5 volts to 3.3 volts and the reset signal RESET will be also increased from 0.5 volts to 3.3 volts with the operating voltage VDD.

Since the reset signal RESET is not decreased to 0 volt, when the power is turned on again, the reset function may be failed, and this may cause the incorrect initial state of the inner circuit of the gate driver and the abnormality of its operation and function. Especially, when the transistor having high threshold voltage VTN or |VTP| is used in the power on reset circuit 1, this reset failure may be easily occurred in certain combinations of manufacturing processes, temperatures and voltages, and the entire operation performance of the gate driver of the display apparatus will be seriously affected.

Therefore, the invention provides a power on reset circuit applied to the gate driver of the display apparatus to solve the above-mentioned problems.

SUMMARY OF THE INVENTION

An embodiment of the invention is a power on reset circuit. In this embodiment, the power on reset circuit is applied to a gate driver of a display apparatus. The power on reset circuit is coupled between an operating voltage and a ground terminal. The power on reset circuit includes an output terminal, a first transistor, a second transistor, a resistor and a buffer circuit. The first transistor is coupled between the operating voltage and a first node. A gate of the first transistor is coupled to the first node. The second transistor is coupled between the operating voltage and the first node. A gate of the second transistor is coupled to the ground terminal. The resistor is coupled between the first node and the ground terminal. The buffer circuit is coupled between the first node and the output terminal and it outputs a reset signal through the output terminal. A second threshold voltage of the second transistor is larger than a first threshold voltage of the first transistor.

In an embodiment, the first transistor and the second transistor are both P-type MOSFETs.

In an embodiment, the buffer circuit includes N buffer modules coupled in series between the first node and the output terminal in order, wherein N is an integer larger than 1.

In an embodiment, an N-th buffer module of the N buffer modules includes an N-th inverter and an N-th transistor. The N-th inverter is coupled between the operating voltage and the ground terminal. A source electrode and a drain electrode of the N-th transistor are coupled to the ground terminal and a gate electrode of the N-th transistor is coupled to a second node.

In an embodiment, when N=1, the second node is coupled with the first node.

In an embodiment, when N>1, the second node is disposed between a (N−1) inverter and the N-th inverter.

In an embodiment, the N-th transistor is an N-type MOSFET.

In an embodiment, the second transistor has body effect, but the first transistor has no body effect.

In an embodiment, a size of the second transistor is different from a size of the first transistor.

Another embodiment of the invention is also a power on reset circuit. In this embodiment, the power on reset circuit is applied to a gate driver of a display apparatus and coupled between an operating voltage and a ground terminal. The power on reset circuit includes an output terminal, a first resistor, a transistor, a second resistor and a buffer circuit. The first resistor is coupled between the operating voltage and a first node. The transistor is coupled between the operating voltage and the first node, wherein a gate electrode of the transistor is coupled to the ground terminal. The second resistor is coupled between the first node and the ground terminal. The buffer circuit is coupled between the first node and the output terminal and configured to output a reset signal through the output terminal. A first threshold voltage of the first transistor is larger than a second threshold voltage of the second transistor.

Compared to the prior art, when the power on reset circuit of the invention is applied to the gate driver of the display apparatus, the reset signal failure condition that the power is abnormally turned on or off can be effectively improved. Especially, when the transistor of the power on reset circuit has high threshold voltage VTN or |VTP|, no matter in any combinations of manufacturing processes, temperatures and voltages, the power on reset circuit of the invention can provide the reset function under the condition that the power is abnormally turned on or off.

The advantage and spirit of the invention may be understood by the following detailed descriptions together with the appended drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

An embodiment of the invention is a power on reset circuit. In this embodiment, the power on reset circuit can be applied to a gate driver of a display apparatus, but not limited to this.

Figure 1:
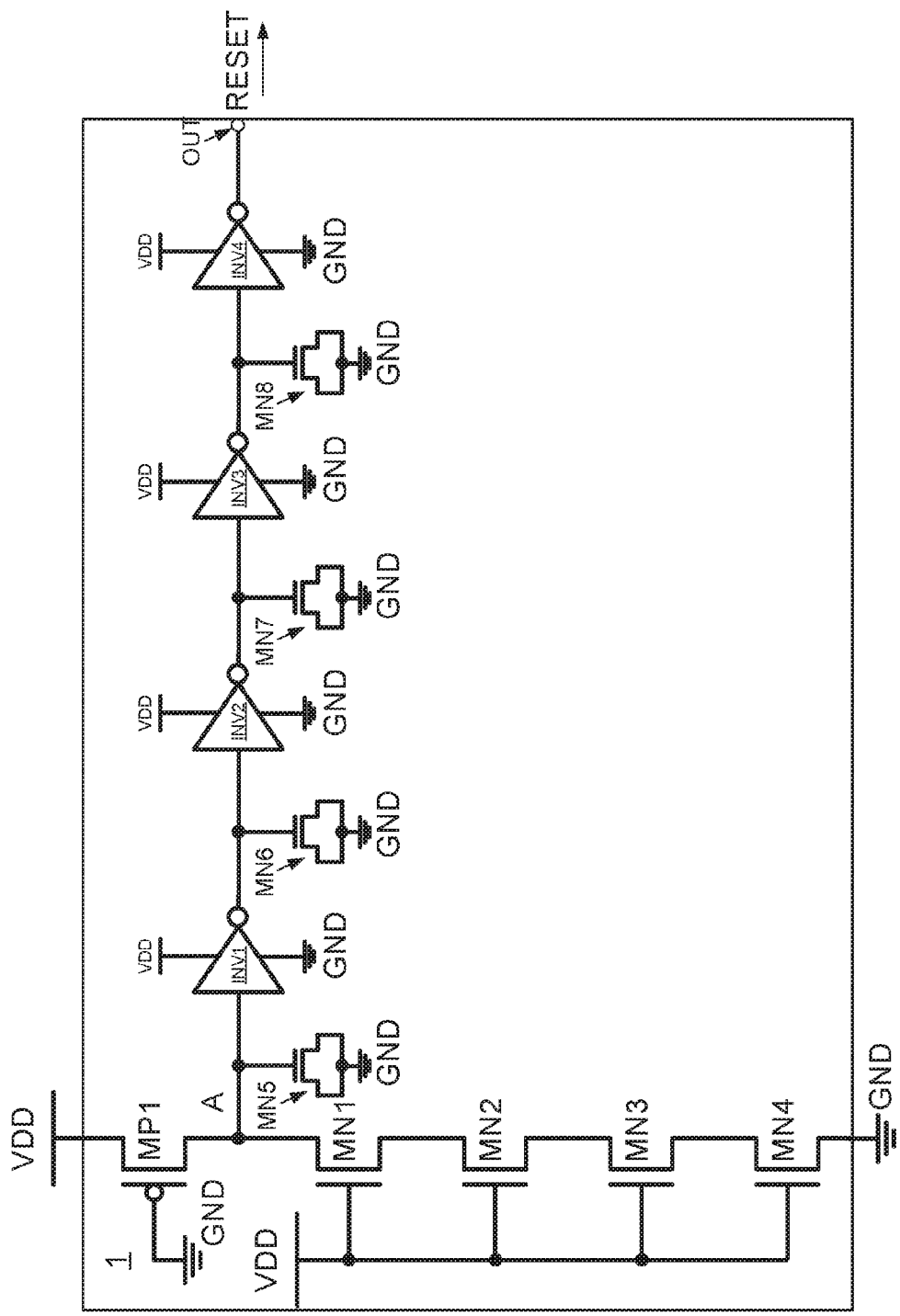
FIG. 1 illustrates a schematic diagram of a conventional power on reset circuit.
Figure 2:
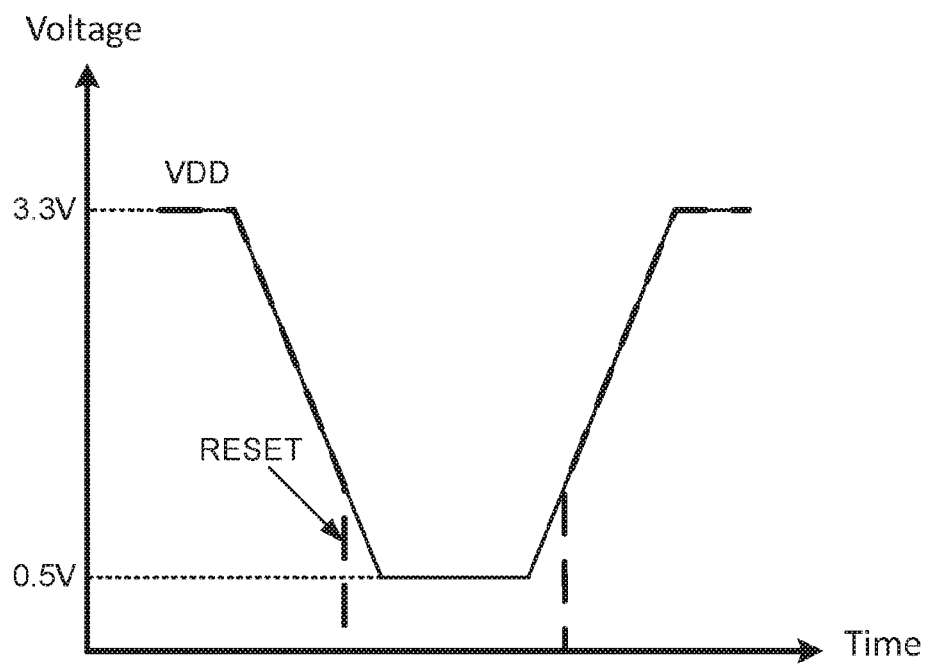
FIG. 2 illustrates a schematic diagram that when the power is turned off, the operating voltage is only decreased to 0.5 volts but the reset signal is decreased to 0 volt to provide the reset function.
Figure 3:
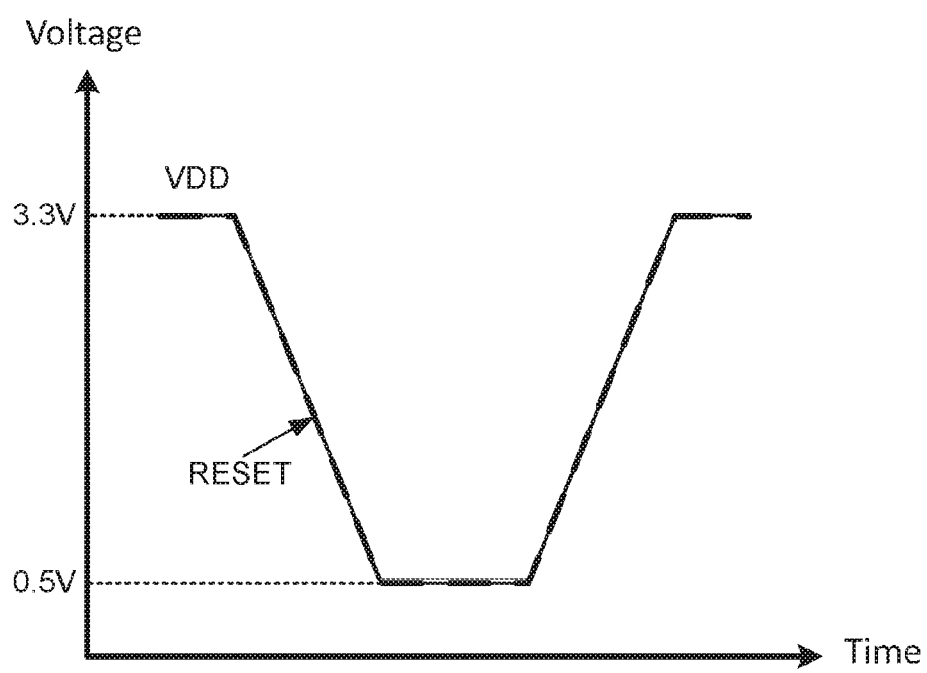
FIG. 3 illustrates a schematic diagram that when the power is turned off, the operating voltage is only decreased to 0.5 volts and the reset signal is maintained at 0.5 volts and the reset function is failed.
Figure 4:
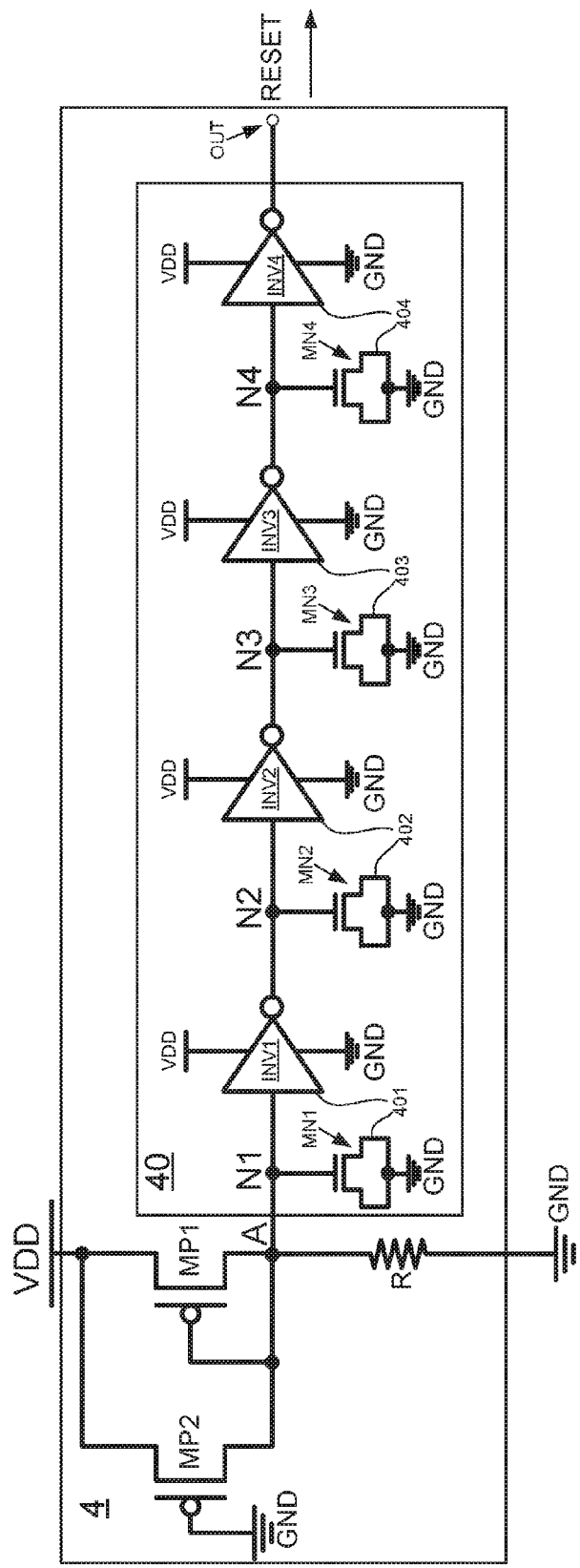
FIG. 4 illustrates a schematic diagram of a power on reset circuit in a preferred embodiment of the invention.

Please refer to FIG. 4. FIG. 4 illustrates a schematic diagram of a power on reset circuit in this embodiment. As shown in FIG. 4, the power on reset circuit 4 is coupled between an operating voltage VDD and a ground terminal GND; the power on reset circuit 4 is used to output a reset signal RESET.

In this embodiment, the power on reset circuit 4 includes an output terminal OUT, a first transistor MP1, a second transistor MP2, a resistor R and a buffer circuit 40. The first transistor MP1 is coupled between the operating voltage VDD and a first node A. A gate of the first transistor MP1 is coupled to the first node A. The second transistor MP2 is coupled between the operating voltage VDD and the first node A. A gate of the second transistor MP2 is coupled to the ground terminal GND. The resistor R is coupled between the first node A and the ground terminal GND. The buffer circuit 40 is coupled between the first node A and the output terminal OUT and it outputs a reset signal RESET through the output terminal OUT.

In this embodiment, the buffer circuit 40 includes four buffer modules 401~404, but in fact, the number of the buffer modules of the buffer circuit 40 is not limited to this. The four buffer modules 401~404 are coupled in series between the first node A and the output terminal OUT in order.

The buffer module 401 includes an inverter INV1 and a transistor MN1. The inverter INV1 is coupled between the operating voltage VDD and the ground terminal GND; an input terminal of the inverter INV1 is coupled to the first node A. The transistor MN1 is an N-type MOSFET. A source electrode and a drain electrode of the transistor MN1 are coupled to the ground terminal GND and a gate electrode of the transistor MN1 is coupled to the node N1. The node N1 is coupled to the first node A.

The buffer module 402 includes an inverter INV2 and a transistor MN2. The inverter INV2 is coupled between the operating voltage VDD and the ground terminal GND; an input terminal of the inverter INV2 is coupled to an output terminal of the inverter INV1. The transistor MN2 is an N-type MOSFET. A source electrode and a drain electrode of the transistor MN2 are coupled to the ground terminal GND and a gate electrode of the transistor MN2 is coupled to the node N2. The node N2 is located between the inverters INV1 and INV2.

The buffer module 403 includes an inverter INV3 and a transistor MN3. The inverter INV3 is coupled between the operating voltage VDD and the ground terminal GND; an input terminal of the inverter INV3 is coupled to an output terminal of the inverter INV2. The transistor MN3 is an N-type MOSFET. A source electrode and a drain electrode of the transistor MN3 are coupled to the ground terminal GND and a gate electrode of the transistor MN3 is coupled to the node N3. The node N3 is located between the inverters INV2 and INV3.

The buffer module 404 includes an inverter INV4 and a transistor MN4. The inverter INV4 is coupled between the operating voltage VDD and the ground terminal GND; an input terminal of the inverter INV4 is coupled to an output terminal of the inverter INV3. The transistor MN4 is an N-type MOSFET. A source electrode and a drain electrode of the transistor MN4 are coupled to the ground terminal GND and a gate electrode of the transistor MN4 is coupled to the node N4. The node N4 is located between the inverters INV3 and INV4. An output terminal of the inverter INV4 is coupled to the output terminal OUT of the power on reset circuit 4.

It should be noticed that the inverters INV1~INV4 can be a NOT gate used for inverting operation; the inverters INV1~INV4 have an input terminal and an output terminal; the state of the output terminal and the state of the input terminal will be opposite.

Figure 5:
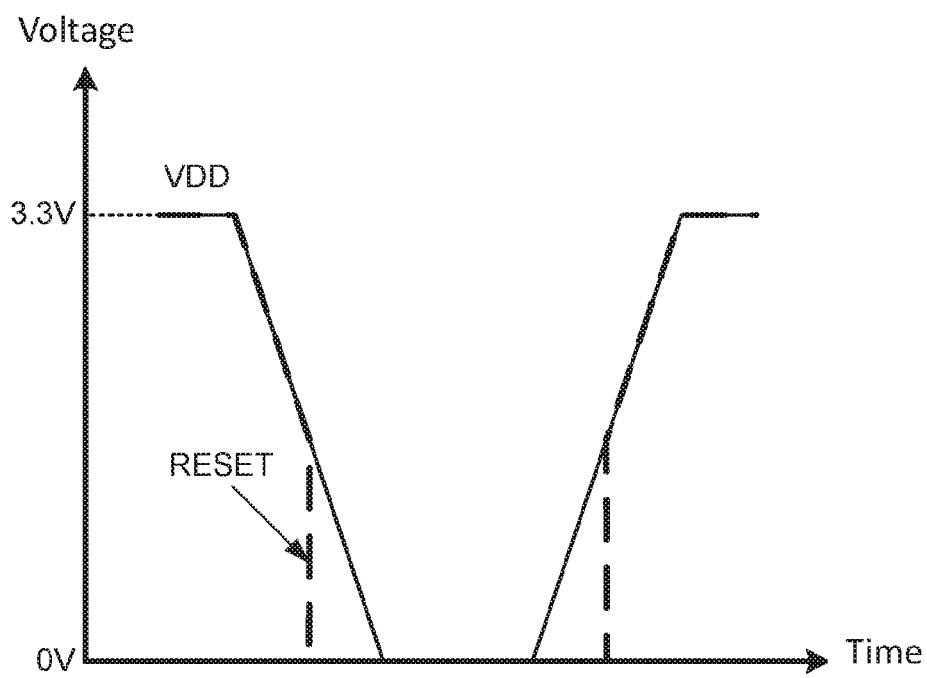
FIG. 5 illustrates a schematic diagram of the reset signal and the operating voltage varied with time under the normal condition.

Please refer to FIG. 5. FIG. 5 illustrates a schematic diagram of the reset signal and the operating voltage varied with time under the normal condition. As shown in FIG. 5, when the power is turned off, the operating voltage VDD is decreased from 3.3 volts to 0 volt and the reset signal RESET is also decreased from 3.3 volts to 0 volt. The time that the reset signal RESET is decreased to 0 volt is a period of time Δt1 earlier than the time that the operating voltage VDD is decreased to 0 volt. When the power is turned on, the operating voltage VDD is increased from 0 volt to 3.3 volts, but the reset signal RESET is not increased from 0 volt to 3.3 volts immediately. Instead, after a period of delay time Δt2, the reset signal RESET starts to be increased from 0 volt to 3.3 volts. This delay time Δt2 is used for the D flip-flops (DFFs) disposed in the gate driver circuit to be reset to the correct initial state by the reset signal RESET.

It should be noticed that the first transistor MP1 and the second transistor MP2 in this embodiment should be both P-type MOSFETs; the second threshold voltage |VTP2| of the second transistor MP2 should be higher than the first threshold voltage |VTP1| of the first transistor MP1.

For example, in the circuit design, the base electrode and the source electrode of the second transistor MP2 are not directly connected to generate the body effect, but the base electrode and the source electrode of the first transistor MP1 are directly connected, so that the first transistor MP1 has no body effect; or the first transistor MP1 and the second transistor MP2 have different sizes, so that the second threshold voltage |VTP2| of the second transistor MP2 can be higher than the first threshold voltage |VTP1| of the first transistor MP1.

Figure 6:
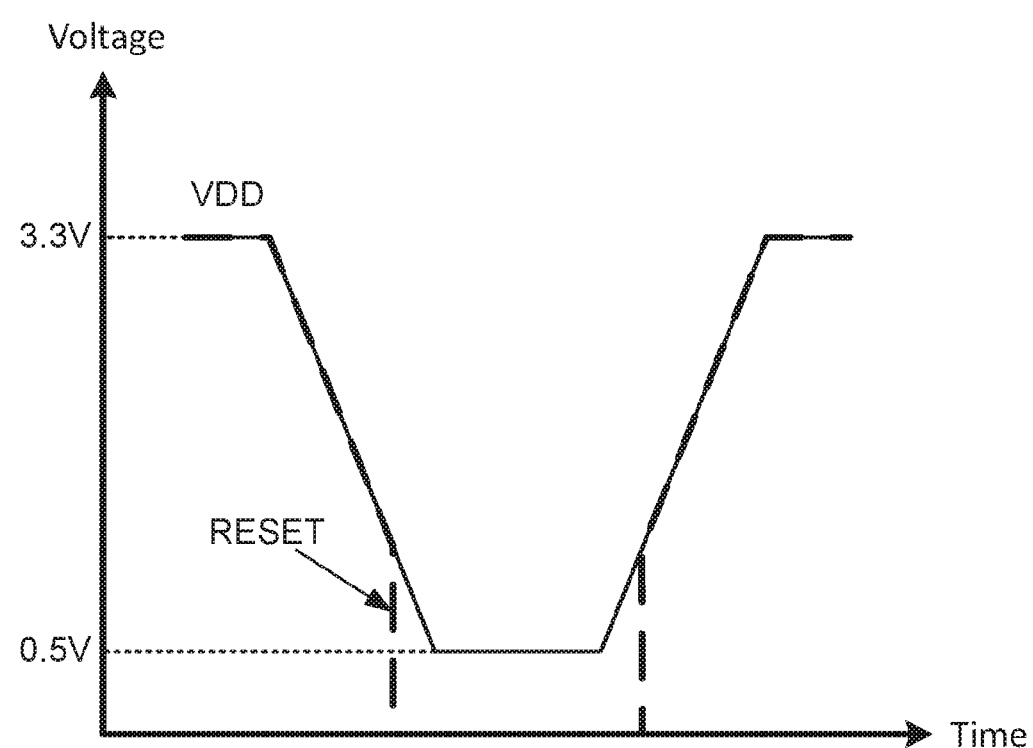
FIG. 6 illustrates a schematic diagram that when the power is turned off, the operating voltage is not decreased to 0 volt but the reset signal is decreased to 0 volt to provide the reset function.

As shown in FIG. 6, in this circuit structure, when the power is turned off, once the operating voltage VDD is only decreased to 0.5 volts instead of 0 volt, even the second transistor MP2 having the higher second threshold voltage |VTP2| is gradually turned off, the first node A can still have the voltage level of VDD-|VGS1|, so that it can be decreased lower than the input low threshold (VIL) of the inverter INV1 faster, wherein |VGS1| is a gate-source voltage of the first transistor MP1.

In addition, since it is the resistor R, not the conventional N-type MOSFET, disposed between the first node A and the ground terminal GND, the condition that the first node A fails to discharge to the ground terminal GND because the conventional N-type MOSFET cannot be turned on when the voltage is too low can be prevented.

If there is only one transistor (the first transistor MP1) in the power on reset circuit, even the operating voltage VDD reaches normal voltage level, the first threshold voltage |VTP1| of the first transistor MP1 may be too high due to the manufacturing process, voltage or temperature, and it will cause that the voltage of the first node A is lower than the input low threshold voltage of the inverter INV1 and the reset signal RESET will be 0 volt; therefore, when the operating voltage VDD reaches normal voltage level, the second transistor MP2 can help the voltage of the node A also reach the normal voltage level, so that the voltage of the first node A will be not lower than the input low threshold voltage of the inverter INV1 and the reset signal RESET will not be 0 volt.

In summary, when the transistor having large threshold voltage VTN or |VTP| is used, even the power is abnormally turned on or off, this embodiment can help to smoothly output the reset signal RESET to achieve the power on reset function, so that there will be no reset failure occurs.

Figure 7:
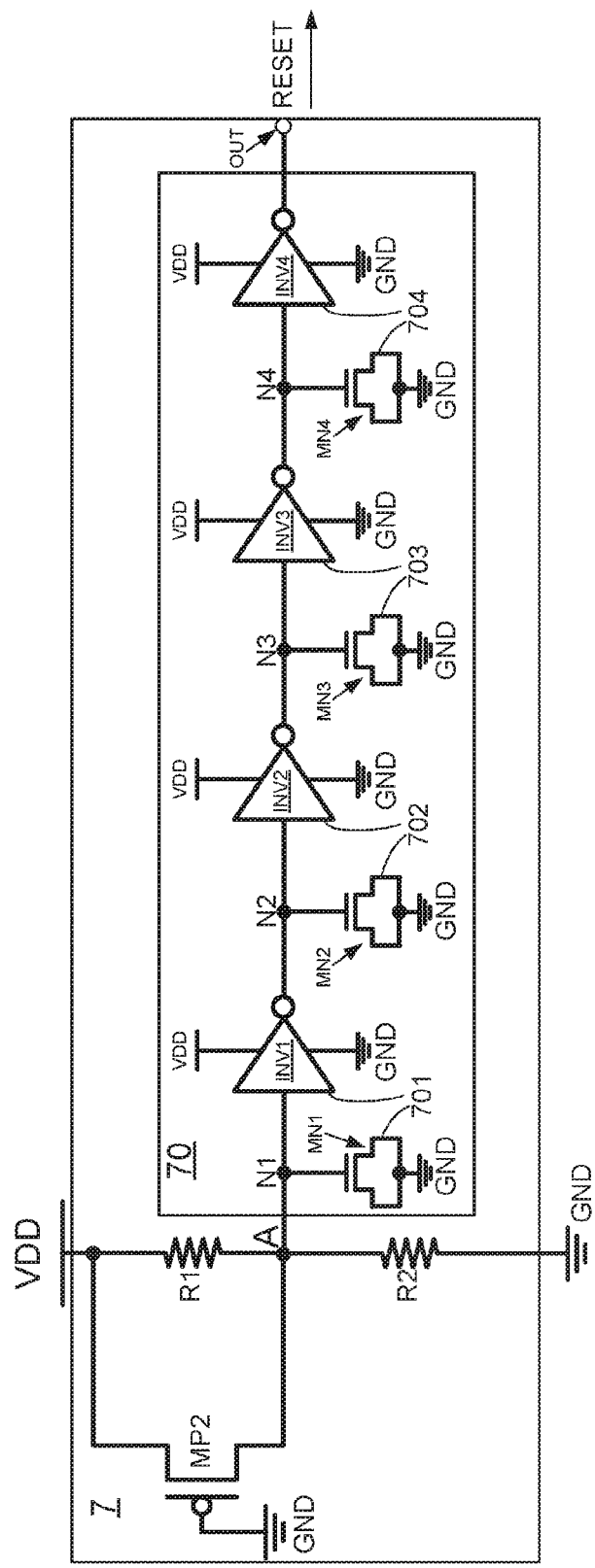
FIG. 7 illustrates a schematic diagram of a power on reset circuit in another preferred embodiment of the invention.

Then, please refer to FIG. 7. FIG. 7 illustrates a schematic diagram of a power on reset circuit in another preferred embodiment of the invention.

In this embodiment, the power on reset circuit 7 is coupled between an operating voltage VDD and a ground terminal GND. The power on reset circuit 7 includes an output terminal OUT, a first resistor R1, a transistor MP2, a second resistor R2 and a buffer circuit 70. The first resistor R1 is coupled between the operating voltage VDD and a first node A. The transistor MP2 is coupled between the operating voltage VDD and the first node A. A gate electrode of the transistor MP2 is coupled to the ground terminal GND. The second resistor R2 is coupled between the first node A and the ground terminal GND. The buffer circuit 70 is coupled between the first node A and the output terminal OUT and configured to output a reset signal RESET through the output terminal OUT.

In this embodiment, the buffer circuit 70 includes four buffer modules 701~704, but in fact, the number of the buffer modules of the buffer circuit 70 is not limited to this. The four buffer modules 701~704 are coupled in series between the first node A and the output terminal OUT in order.

The buffer module 701 includes an inverter INV1 and a transistor MN1. The inverter INV1 is coupled between the operating voltage VDD and the ground terminal GND; an input terminal of the inverter INV1 is coupled to the first node A. The transistor MN1 is an N-type MOSFET. A source electrode and a drain electrode of the transistor MN1 are coupled to the ground terminal GND and a gate electrode of the transistor MN1 is coupled to the node N1. The node N1 is coupled to the first node A.

The buffer module 702 includes an inverter INV2 and a transistor MN2. The inverter INV2 is coupled between the operating voltage VDD and the ground terminal GND; an input terminal of the inverter INV2 is coupled to an output terminal of the inverter INV1. The transistor MN2 is an N-type MOSFET. A source electrode and a drain electrode of the transistor MN2 are coupled to the ground terminal GND and a gate electrode of the transistor MN2 is coupled to the node N2. The node N2 is located between the inverters INV1 and INV2.

The buffer module 703 includes an inverter INV3 and a transistor MN3. The inverter INV3 is coupled between the operating voltage VDD and the ground terminal GND; an input terminal of the inverter INV3 is coupled to an output terminal of the inverter INV2. The transistor MN3 is an N-type MOSFET. A source electrode and a drain electrode of the transistor MN3 are coupled to the ground terminal GND and a gate electrode of the transistor MN3 is coupled to the node N3. The node N3 is located between the inverters INV2 and INV3.

The buffer module 704 includes an inverter INV4 and a transistor MN4. The inverter INV4 is coupled between the operating voltage VDD and the ground terminal GND; an input terminal of the inverter INV4 is coupled to an output terminal of the inverter INV3. The transistor MN4 is an N-type MOSFET. A source electrode and a drain electrode of the transistor MN4 are coupled to the ground terminal GND and a gate electrode of the transistor MN4 is coupled to the node N4. The node N4 is located between the inverters INV3 and INV4. An output terminal of the inverter INV4 is coupled to the output terminal OUT of the power on reset circuit 4.

It should be noticed that the inverters INV1~INV4 can be a NOT gate used for inverting operation; the inverters INV1~INV4 have an input terminal and an output terminal; the state of the output terminal and the state of the input terminal will be opposite. The first resistance of the first resistor R1 should be larger than the second resistance of the second resistor R2 in this embodiment.

As shown in FIG. 6, in this circuit structure, when the power is turned off, once the operating voltage VDD is only decreased to 0.5 volts instead of 0 volt, even the second transistor MP2 is gradually turned off, the first resistor R1 and the second resistor R2 can be used as dividing resistors to divide the operating voltage VDD, so that the voltage level of the first node A can be decreased lower than the input low threshold (VIL) of the inverter INV1 faster.

If there is only one transistor (the first transistor MP1) in the power on reset circuit, even the operating voltage VDD reaches normal voltage level, the voltage of the first node A may be lower than the input low threshold voltage of the inverter INV1 and the reset signal RESET will be 0 volt; therefore, when the operating voltage VDD reaches normal voltage level, the second transistor MP2 can help the voltage of the node A also reach the normal voltage level, so that the voltage of the first node A will be not lower than the input low threshold voltage of the inverter INV1 and the reset signal RESET will not be 0 volt.

Compared to the prior art, when the power on reset circuit of the invention is applied to the gate driver of the display apparatus, the reset signal failure condition that the power is abnormally turned on or off can be effectively improved. Especially, when the transistor of the power on reset circuit has high threshold voltage VTN or |VTP|, no matter in any combinations of manufacturing processes, temperatures and voltages, the power on reset circuit of the invention can provide the reset function under the condition that the power is abnormally turned on or off.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

The invention claimed is:

1. A power on reset circuit applied to a gate driver of a display apparatus and coupled between an operating voltage and a ground terminal, the power on reset circuit comprising:
   an output terminal;
   a first transistor coupled between the operating voltage and a first node, wherein a gate electrode of the first transistor is coupled to the first node;
   a second transistor coupled between the operating voltage and the first node, wherein a gate electrode of the second transistor is coupled to the ground terminal;
   a resistor coupled between the first node and the ground terminal; and
   a buffer circuit coupled between the first node and the output terminal and configured to output a reset signal through the output terminal;
   wherein a second threshold voltage of the second transistor is larger than a first threshold voltage of the first transistor.

2. The power on reset circuit of claim 1, wherein the first transistor and the second transistor are both P-type MOSFETs.

3. The power on reset circuit of claim 1, wherein the buffer circuit comprises:
   N buffer modules coupled in series between the first node and the output terminal in order, wherein N is an integer larger than 1.

4. The power on reset circuit of claim 3, wherein an N-th buffer module of the N buffer modules comprises:
   an N-th inverter coupled between the operating voltage and the ground terminal; and
   an N-th transistor wherein a source electrode and a drain electrode of the N-th transistor are coupled to the ground terminal and a gate electrode of the N-th transistor is coupled to a second node.

5. The power on reset circuit of claim 4, wherein when N=1, the second node is coupled with the first node.

6. The power on reset circuit of claim 4, wherein when N>1, the second node is disposed between a (N−1) inverter and the N-th inverter.

7. The power on reset circuit of claim 4, wherein the N-th transistor is an N-type MOSFET.

8. The power on reset circuit of claim 1, wherein the second transistor has body effect, but the first transistor has no body effect.

9. The power on reset circuit of claim 1, wherein a size of the second transistor is different from a size of the first transistor.

* * * * *